United States Patent
Nakata et al.

(10) Patent No.: US 6,558,747 B2
(45) Date of Patent: May 6, 2003

(54) METHOD OF FORMING INSULATING FILM AND PROCESS FOR PRODUCING SEMICONDUCTOR DEVICE

(75) Inventors: Rempei Nakata, Kamakura (JP); Nobuhide Yamada, Tokyo (JP); Hideshi Miyajima, Yokohama (JP); Akihiro Kojima, Yokohama (JP); Takahiko Kurosawa, Goleta, CA (US); Eiji Hayashi, Tsuchiura (JP); Youngsoon Seo, Tsukuba (KR); Atsushi Shiota, Tsukuba (JP); Kinji Yamada, Tsukuba (JP)

(73) Assignees: Kabushiki Kaisha Toshiba, Tokyo (JP); JSR Corporation, Tokyo (JP)

( * ) Notice: Subject to any disclaimer, the term of this patent is extended or adjusted under 35 U.S.C. 154(b) by 0 days.

(21) Appl. No.: 10/014,593

(22) Filed: Dec. 14, 2001

(65) Prior Publication Data

US 2002/0086169 A1 Jul. 4, 2002

Related U.S. Application Data

(63) Continuation-in-part of application No. 09/670,547, filed on Sep. 27, 2000, now Pat. No. 6,410,151.

(30) Foreign Application Priority Data

Sep. 29, 1999 (JP) .............................. 11-275554
Dec. 15, 2000 (JP) ........................ 2000-382493

(51) Int. Cl.$^7$ ......................................... B05D 379/397

(52) U.S. Cl. ................. 427/387; 427/3; 427/2

(58) Field of Search .................. 427/387; 438/781, 438/787, 790

(56) References Cited

U.S. PATENT DOCUMENTS

| 5,733,644 A | 3/1998 | Tanaka et al. |
| 5,872,194 A | 2/1999 | Isshiki et al. |
| 6,043,330 A | 3/2000 | Hacker et al. |
| 6,072,012 A | * 6/2000 | Juen et al. ................... 525/478 |
| 6,287,701 B1 | * 9/2001 | Oochi et al. ................. 428/447 |

FOREIGN PATENT DOCUMENTS

| JP | 61-56870 | 12/1986 |
| JP | 2000-256642 | * 9/2000 |

OTHER PUBLICATIONS

U.S. patent application Ser. No. 09/670,547, filed Sep. 27, 2000, pending.
U.S. patent application Ser. No. 09/778,822, filed Feb. 8, 2001, pending.
U.S. patent application Ser. No. 09/791,619, filed Feb. 26, 2001, pending.

* cited by examiner

Primary Examiner—Robert Dawson
Assistant Examiner—Christopher M. Keehan
(74) Attorney, Agent, or Firm—Oblon, Spivak, McClelland, Maier & Neustadt, P.C.

(57) ABSTRACT

A method of forming an insulating film which includes the steps of: dissolving in a solvent a first and second polymer which each comprise methylpolysiloxane as the main component and one of which has a weight average molecular weight at least 10 times that of the other to thereby prepare a chemical solution; applying the chemical solution to a semiconductor substrate to form a coating film; and heat-treating the coating film to thereby form an organosilicon oxide film. The weight-average molecular weight of the first polymer is preferably at least 100 times that of the second polymer. Thus, an insulating organosilicon oxide film having a low dielectric constant and high cracking resistance is formed from a coating fluid.

20 Claims, 6 Drawing Sheets

METHOD OF FORMING INSULATING FILM AND PROCESS FOR PRODUCING SEMICONDUCTOR DEVICE

CROSS-REFERENCE TO THE RELATED APPLICATION

This application is a continuation-in-part application of application Ser. No. 09/670,547, filed Sep. 27, 2000 now U.S. Pat. No. 6,410,151 B1, entitled "COMPOSITION FOR FILM FORMATION, METHOD OF FILM FORMATION, AND INSULATING FILM".

FIELD OF THE INVENTION

The present invention relates to a method of forming an insulating film, more particularly, a method of forming a low dielectric constant insulating film by a coating method. The invention further relates to a process for producing a semiconductor device using the insulating film as an interlayer dielectric.

DESCRIPTION OF THE RELATED ART

In semiconductor devices, wiring resistance and wiring capacitance are increasing steadily with the trend toward wiring size reduction, and this is coming to considerably influence the operating frequency and power consumption of devices. Investigations are hence being made enthusiastically on the use of organosilicon oxide films or organic films formed from a coating fluid as interlayer dielectrics in order to reduce the wiring capacitance and attain higher speed device operation. Such organic films are advantageous in that they have a lower dielectric constant than silicon oxide films formed by the plasma CVD method (p-$SiO_2$; k=4.1) and fluorine-containing silicon oxide films formed by the method (FSG; k=3.3–3.8). However, the organic films each have both merits and demerits as compared with the p-$SiO_2$ and FSG which have hitherto been used, and there are various problems which should be overcome in order to use such organic films as interlayer dielectrics in LSI's.

An organosilicon oxide film is usually formed by the following procedure. First, an organic solvent solution (varnish) of a polymer having a relatively low molecular weight, e.g., about 1,000 to 10,000, is applied to a substrate, and the coating is dried to remove the organic solvent. Thereafter, the polymer is thermally polymerized to form an organosilicon oxide film. The film thus obtained has poor cracking resistance and, hence, it has been difficult to use this film as a single-layer interlayer dielectric in LSI's. Polymethylsilsesquioxane (MSQ) films, for example, have a dielectric constant as low as from 2.5 to 3.0 and are expected to be applied to high-performance high-speed semiconductor devices. However, the modulus of elasticity of the MSQ films is 4 GPa, which is far lower than the modulus of elasticity of the related-art CVD silicon oxide films, which is 70 GPa. Because of this, it has been exceedingly difficult to use organosilicon oxide films in a wide range of applications as an interlayer dielectric for multilayered wiring structures comprising five or more layers for use in high-performance semiconductor devices.

SUMMARY OF THE INVENTION

The invention has been achieved under the circumstances described above.

One object of the invention is to provide a method of forming an insulating organosilicon oxide film having low dielectric constant and high cracking resistance by a coating method.

Another object of the invention is to provide a process for producing a semiconductor device which is reduced in wiring capacitance and power consumption and can be operated at high speed.

In order to eliminate the problem described above, the invention provides a method of forming an insulating film, which comprises the steps of:

dissolving in a solvent a first polymer and a second polymer which each comprise methylpolysiloxane as the main component and one of which has a weight average molecular weight at least 10 times the weight average molecular weight of the other to thereby prepare a chemical solution;

applying the chemical solution to a semiconductor substrate to form a coating film; and heat-treating the coating film, thereby forming an organosilicon oxide film.

The invention further provides a process for producing a semiconductor device, which comprises the steps of:

dissolving in a solvent a first polymer and a second polymer which each comprise methylpolysiloxane as the main component and one of which has a weight average molecular weight at least 10 times the weight average molecular weight of the other to thereby prepare a chemical solution;

applying the chemical solution to a semiconductor substrate having elements arranged thereon to form a coating film;

heat-treating the coating film, thereby forming an interlayer dielectric comprising an organosilicon oxide film; and forming a wiring on the interlayer dielectric.

BRIEF DESCRIPTION OF THE DRAWINGS

The foregoing and other objects and advantages of the invention will be apparent from the following detailed description and the accompanying drawings, in which.

DETAILED DESCRIPTION OF THE INVENTION

Practical embodiments according to the invention will be explained in detail below.

Figure 1:
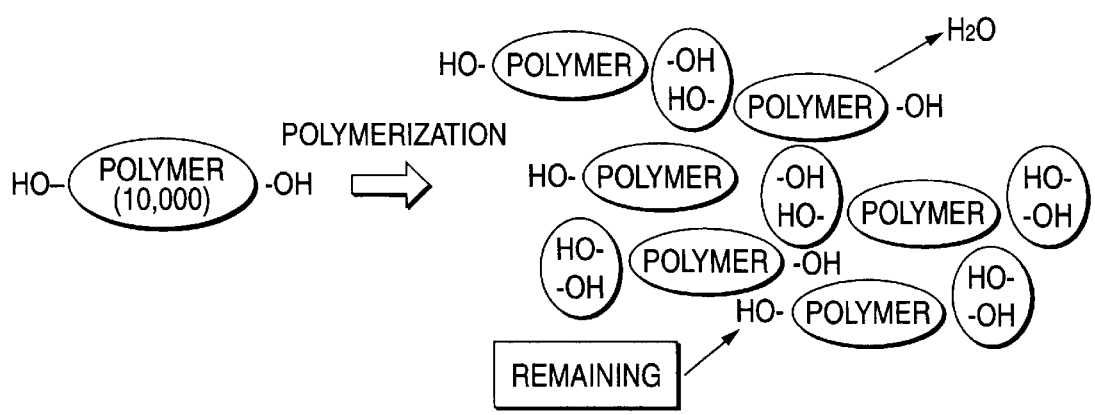
FIG. 1 is a schematic view explaining the mechanism of a decrease in dielectric constant in the conventional organosilicon oxide film.

The present inventors made intensive investigations on conventional organosilicon oxide films formed from methylpolysiloxane having a weight average molecular weight of about 10,000. As a result, they found that the increase in dielectric constant in such organosilicon oxide films is attributable to the following phenomenon. When methylpolysiloxane having a relatively low weight average molecular weight, e.g., about 10,000, is polymerized alone, the resulting organosilicon film contains a large amount of —OH groups remaining therein as shown in the schematic view of FIG. 1. The —OH groups remaining in the film are thought to function as crosslink defects to bring about reduced properties of the organosilicon oxide film, i.e., reduced cracking resistance and an increase in dielectric constant due to water adsorption onto the —OH groups.

Figure 2:
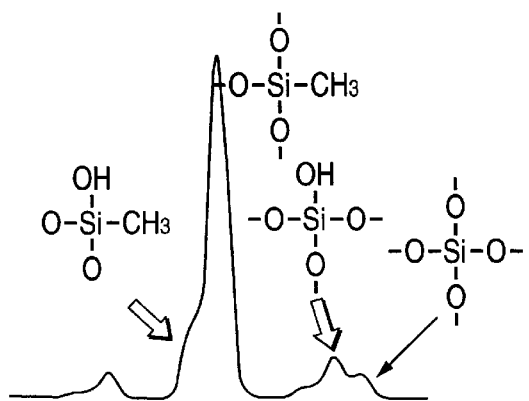
FIG. 2 is an NMR spectrum of the conventional organosilicon oxide film.

An organosilicon oxide film formed from methylpolysiloxane having a molecular weight of 10,000 was examined for NMR spectrum. As a result, a peak attributable to —OH was observed as shown in FIG. 2.

The inventors made further investigations based on this finding and, as a result, have found that a method effective in inhibiting the decrease in dielectric constant is to diminish the —OH groups remaining in an organosilicon oxide film formed through thermal polymerization and thereby inhibit $H_2O$ generation. They have further found that an organosilicon oxide film having a low dielectric constant and high cracking resistance and capable of being used as a single-layer interlayer dielectric for LSI's can be formed from a coating fluid by using a mixture of high molecular methylpolysiloxane and low molecular methylpolysiloxane. The invention has been achieved based on these findings.

In order to form an organosilicon oxide film having those properties, a mixture of first and second polymers is used, which each comprise methylpolysiloxane as the main component and one of which has a weight average molecular weight at least 10 times the weight average molecular weight of the other. The weight average molecular weight of the first polymer is preferably at least 100 times the weight average molecular weight of the second polymer. Furthermore, the weight average molecular weight of the first polymer is preferably 1,000,000 or higher and the weight average molecular weight of the second polymer is preferably 10,000 or lower. The first polymer, having a high weight average molecular weight, contributes to improvements in the cracking resistance, degree of condensation, and low-temperature curability of the organosilicon oxide film to be obtained. On the other hand, the second polymer, having a low weight average molecular weight, contributes to improvements in the strength and $O_2$-RIE resistance of the organosilicon oxide film to be obtained.

Examples of the first and second polymers comprising methylpolysiloxane as the main component include compounds represented by the following formula (1):

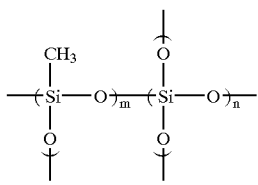

wherein m and n each are an integer indicating the degree of polymerization, and the ratio of the number of $CH_3$ groups to that of silicon atoms in the compound ($CH_3$/Si) is from 0.3 to 1.0.

Figure 3:
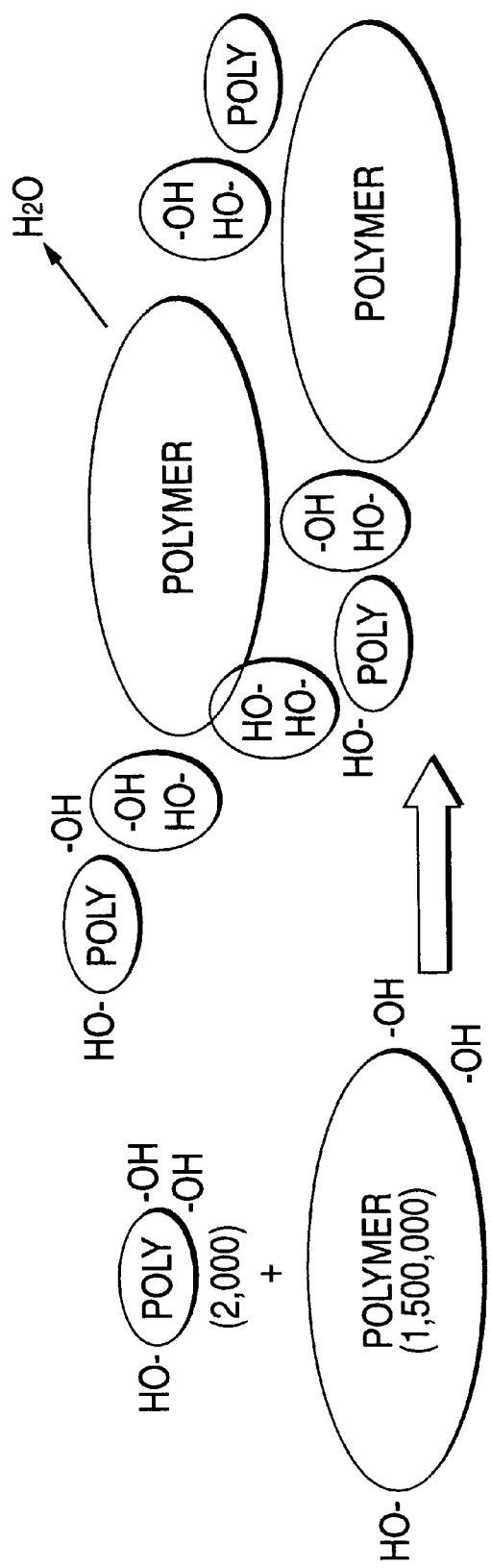
FIG. 3 is a schematic view explaining the mechanism of thermal polymerization in forming an organosilicon oxide film by one embodiment of the method of the invention.

When a mixture of first and second polymers having weight average molecular weights of 1,500,000 and 2,000, respectively, is used to form an organosilicon oxide film through thermal polymerization, the resulting organosilicon oxide has a structure in which the first polymer, having a high molecular weight, constitutes a backbone and the second polymer, having a low molecular weight, is present so as to fill spaces in the backbone, as shown by the schematic view of FIG. 3. Due to the blending of the two polymers differing in molecular weight, this organosilicon oxide film has a smaller amount of residual —OH groups than the conventional organosilicon oxide films.

Figure 4:
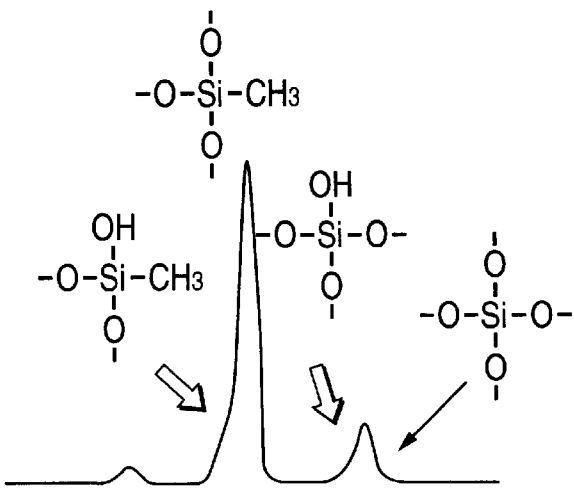
FIG. 4 is an NMR spectrum of an organosilicon oxide film formed by another embodiment of the method of the invention.

FIG. 4 shows an NMR spectrum of an organosilicon oxide film formed from a chemical solution containing a blend of a first polymer having a weight average molecular weight of 1,500,000 and a second polymer having a weight average molecular weight of 2,000 in a proportion of 30/70 (by weight). This film was ascertained to have no peak attributable to —OH groups.

As long as the weight average molecular weights of the first polymer, which is a high molecular polymer, and the second polymer, which is a low molecular polymer, are within the respective ranges specified above, the desired effects can basically be obtained. However, in case where the first polymer has too high a weight average molecular weight, it is difficult to prepare a solution and to apply the solution to a substrate. Consequently, the upper limit of the weight average molecular weight of the first polymer is desirably the highest value which enables easy solution preparation, specifically, about 3,000,000. The more preferred range of the weight average molecular weight of the first polymer is about 1,000,000 to 2,000,000.

On the other hand, the second polymer, which is a low molecular polymer, desirably has the lowest possible weight average molecular weight within a range in which it is a polymer, so as to fill spaces in the backbone formed by the thermal hardening of the first polymer, which is a high molecular polymer. Specifically, the weight average molecular weight of the second polymer is more preferably from 1,000 to 10,000.

The product of the first polymer is preferably obtained by hydrolyzing and condensing, in the presence of an alkali catalyst, at least one silane compound selected from the group consisting of compounds (1) to (3). Compounds (1) to (3) and the alkali catalyst are described below.

wherein R represents hydrogen atom, fluorine atom, or a monovalent organic group; $R^1$ represents a monovalent organic group; and a is an integer of 1 or 2;

wherein $R^2$ represents a monovalent organic group;

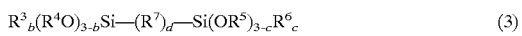

wherein $R^3$ to $R^6$ may be the same or different and each represent a monovalent organic group; b and c may be the same or different and each are an integer of 0 to 2; $R^7$ represents oxygen atom, a phenylene group, or a group represented by —$(CH_2)_n$—, wherein n is an integer of 1 to 6; and d is 0 or 1.

Compounds (1):

Examples of the monovalent organic groups represented by R and $R^1$ in the formula (1) include alkyl group, aryl group, allyl group and glycidyl group. In the formula (1), R is preferably a monovalent organic group, especially alkyl group or phenyl group.

The alkyl group preferably has 1 to 5 carbon atoms, and examples thereof include methyl ethyl, propyl and butyl. Those alkyl groups may be linear or branched, and may be ones in which one or more of the hydrogen atoms have been replaced with, for example, fluorine atoms.

In the formula (1), examples of the aryl group include phenyl, nahthyl, methylphenyl, ethylphenyl, chlorophenyl, bromophenyl and fluorophenyl.

Specific examples of the compounds represented by the formula (1) include:
methyltrimethoxysilane, methyltriethoxysilane,
methyltri-n-propoxysilane, methyltriisopropoxysilane,
ethyltrimethoxysilane, ethyltriethoxysilane,
vinyltrimethoxysilane, vinyltriethoxysilane,
phenyltrimethoxysilane, phenyltriethoxysilane,
dimethyldimethoxysilane, dimethyldiethoxysilane,
diethyldimethoxysilane, diethyldiethoxysilane,
diphenyldimethoxysilane, and diphenyldiethoxysilane.

Those compounds may be used alone or as a mixture of two or more thereof.

Compounds (2):

Examples of the monovalent organic group in the formula (2) include the same organic groups as those enumerated above with regard to the formula (1).

Examples of the compounds represented by the formula (2) include
tetramethoxysilane, tetraethoxysilane,
tetra-n-propoxysilane, tetraisopropoxysilane,
tetra-n-butoxysilane, tetra-sec-butoxysilane,
tetra-tert-butoxysilane, and tetraphenoxysilane.

Compounds (3):

Examples of the monovalent organic groups in the formula (3) include the same organic groups as those enumerated above with regard to the formula (1).

Examples of the compounds represented by the formula (3) wherein $R^7$ is oxygen atom include
hexamethoxydisiloxane, hexaethoxydisiloxane,
1,1,3,3-tetramethoxy-1,3-dimethyldisiloxane,
1,1,3,3-tetraethoxy-1,3-dimethyldisiloxane,
1,1,3,3-tetramethoxy-1,3-diphenyldisiloxane,
1,3-dimethoxy-1,1,3,3-tetramethyldisiloxane,
1,3-diethoxy-1,1,3,3-tetramethyldisiloxane,
1,3-dimethoxy-1,1,3,3-tetraphenyldisiloxane,
1,3-diethoxy-1,1,3,3-tetraphenyldisiloxane,
hexamethoxydisilane, hexaethoxydisilane,
1,1,2,2-tetramethoxy-1,2-dimethyldisilane,
1,1,2,2-tetraethoxy-1,2-dimethyldisilane,
1,1,2,2-tetramethoxy-1,2-diphenyldisilane,
1,2-dimethoxy-1,1,2,2-tetramethyldisilane,
1,2-diethoxy-1,1,2,2-tetramethyldisilane,
1,2-dimethoxy-1,1,2,2-tetraphenyldisilane,
1,2-diethoxy-1,1,2,2-tetraphenyldisilane,
bis(trimethoxysilyl)methane, bis(triethoxysilyl)methane,
1,2-bis(trimethoxysilyl)ethane,
1,2-bis(triethoxysilyl)ethane,
1-(dimethoxymethylsilyl)-1-(trimethoxysilyl)methane,
1-(diethoxymethylsilyl)-1-(triethoxysilyl)methane,
1-(dimethoxymethylsilyl)-2-(trimethoxysilyl)ethane,
1-(diethoxymethylsilyl)-2-(triethoxysilyl)ethane,
bis (dimethoxymethylsilyl) methane,
bis(diethoxymethylsilyl)methane,
1,2-bis(dimethoxymethylsilyl)ethane,
1,2-bis(diethoxymethylsilyl)ethane,
1,2-bis(trimethoxysilyl)benzene,
1,2-bis(triethoxy lsiyl)benzene,
1,3-bis(trimethoxysilyl)benzene,
1,3-bis(triethoxysilyl)benzene,
1,4-bis(trimethoxysilyl)benzene, and
1,4-bis(triethoxysilyl)benzene.

In the invention, the compounds (1), (2), and (3) described above may be used alone or in combination of two or more thereof to constitute the first polymer.

When at least one silane compound selected from the group consisting of the compounds (1) to (3) as materials for the first polymer is hydrolyzed and condensed, water is preferably used in an amount of from 5 to 50 mol, more preferably from 7 to 30 mol, per mol of the sum of the $R^1O—$, $R^2O—$, $R^4O—$, and $R^5O—$ groups. If water is added in an amount smaller than 5 mol, there is the case where a sufficient dielectric constant and sufficient modulus of elasticity are not obtained. If the amount of water added is larger than 50 mol, there is the case where polymer precipitation or gelation may occur during the hydrolysis and condensation reactions.

Alkali Catalyst:

An alkali catalyst is used in hydrolyzing and condensing at least one silane compound selected from the group consisting of the compounds (1) to (3) for producing the product of hydrolysis and condensation (A) for use in the invention. Examples of the alkali catalyst include inorganic bases and organic bases.

The alkali catalyst is used in an amount of generally from 0.00001 to 0.5 mol, preferably from 0.00005 to 0.5 mol, per mol of the sum of the $R^1O—$, $R^2O—$, $R^4O—$, and $R^5O—$ groups contained in the compounds (1) to (3). As long as the amount of the alkali catalyst used is within that range, there is little possibility that polymer precipitation or gelation might occur during the reactions.

In the first polymer, the proportion of the product of hydrolysis and condensation derived from each compound is as follows, in terms of the product of complete hydrolysis and condensation. The content of the product of hydrolysis and condensation derived from the compound (2) is generally from 25 to 75% by weight, preferably from 30 to 70% by weight, more preferably from 35 to 65% by weight, based on the sum of all the products of hydrolysis and condensation derived from the compounds (1) to (3). The content of the product of hydrolysis and condensation derived from the compound (1) and/or compound (3) is generally from 75 to 25% by weight, preferably from 70 to 30% by weight, more preferably from 65 to 35% by weight, basedon the sum of all the products of hydrolysis and condensation derived from the compounds (1) to (3). When the content of the product of hydrolysis and condensation derived from the compound (2) is from 25 to 75% by weight based on the sum of all the products of hydrolysis and condensation derived from the compounds (1) to (3), then the coating film obtained has a high modulus of elasticity and, in particular, an exceedingly low dielectric constant.

The term "product of complete hydrolysis and condensation" as used herein means a product obtained by a process in which all the $R^1O—$, $R^2O—$, $R^4O—$, and $R^5O—$ groups contained in the compound (1), (2), or (3) are hydrolyzed into SiOH groups and these SiOH groups are completely condensed to form siloxane structures.

In producing the product of hydrolysis and condensation (A), at least one silane compound selected from the group consisting of compounds (1) to (3) is hydrolyzed and condensed in the presence of an alkali catalyst so that the resulting product of hydrolysis and condensation preferably has a weight average molecular weight of from 1,000,000 to 3,000,000. It is preferred to adjust the pH of the resulting composition to 7 or lower.

The second polymer is preferably obtained by hydrolyzing and condensing, in the presence of a metal chelate compound catalyst, at least one silane compound selected from the group consisting of compounds (1) to (3).

Those compounds (1) to (3) are the same as the silane compounds used for the first polymer, and explanations thereon are hence omitted here.

When at least one silane compound selected from the group consisting of the compounds (1) to (3) as materials for the second polymer is hydrolyzed and condensed, water is preferably used in an amount of from 0.25 to 5 mol, more preferably from 0.3 to 3 mol, per mol of the sum of the $R^1O-$, $R^2O-$, $R^4O-$, and $R^5O-$ groups. As long as the amount of water added is in the range of from 0.25 to 5 mol, there is no possibility that coating film uniformity might decrease and there is little possibility that polymer precipitation or gelation might occur during the hydrolysis and condensation reactions.

Metal Chelate Compound Catalyst:

A metal chelate compound catalyst is used in hydrolyzing and condensing at least one silane compound selected from the group consisting of the compounds (1) to (3) for producing the product of hydrolysis and condensation (B) for use in the invention.

Examples of the metal chelate compound include titanium chelate compounds and zirconium chelate compounds.

The metal chelate compound catalyst also is used in an amount of generally from 0.00001 to 0.5 mol, preferably from 0.00005 to 0.1 mol, per mol of the sum of the $R^1O-$, $R^2O-$, $R^4O-$, and $R^5O-$ groups contained in the compounds (1) to (3). As long as the amount of the metal chelate compound catalyst used is within that range, there is little possibility that polymer precipitation or gelation might occur during the reactions.

In producing the product of hydrolysis and the first polymer, at least one silane compound selected from the group consisting of compounds (1) to (3) is hydrolyzed and condensed in the presence of a metal chelate compound catalyst so that the resulting product of hydrolysis and condensation preferably has a weight average molecular weight of from 500 to 300,000. It is preferred to add a β-diketone to the resulting composition.

The β-diketone may be added in an amount of generally from 0.1 to 100 parts by weight, preferably from 0.2 to 80 parts by weight, per 100 parts by weight of ingredient (B) (in terms of the product of complete hydrolysis and condensation).

The proportion of the first polymer to the second polymer (the ratio of the weight of the first polymer to that of the second polymer) is preferably in the range of from 10/90 to 90/10 from the standpoint of improving the cracking resistance of the organosilicon oxide film to be obtained. From the standpoint of dielectric constant, that proportion is desirably in the range of from 20/80 to 80/20.

The first polymer having a high molecular weight and second polymer having a low molecular weight, described above are dissolved in an organic solvent such as an alcohol solvent, ketone solvent, amide solvent or ester solvent to prepare a chemical solution (varnish). Specific examples of the organic solvent include propylene glycol monopropyl ether, propylene glycol monoethyl ether and cyclohexane. The chemical solution may contain titanium, zirconium or the like as a catalyst ingredient in an amount of up to about 1% by weight. An ingredient such as a surfactant may be further added to the chemical solution. Examples of the surfactant include nonionic surfactants, anionic surfactants, cationic surfactants and amphoteric surfactants. Other examples thereof include silicone surfactants, poly(alkylene oxide) surfactants and fluorochemical surfactants.

The chemical solution thus prepared is applied to a semiconductor substrate by, e.g., spin coating, dipping or roller coating to form a coating film. Elements or a lower layer wiring may have been formed on or in the semiconductor substrate beforehand. Thereafter, the substrate coated is heat-treated with a hot plate, oven, furnace or the like, for example, at 80° C. for 1 minute and then at 200° C. for 1 minute to volatilize the solvent. The heating is conducted in, for example, an argon atmosphere, under vacuum or under reduced pressure having a controlled oxygen concentration.

Subsequently, the coating is heat-treated, for example, at 380° C. in $N_2$ ($O_2$ concentration, 500 ppm or lower) for about 20 minutes, whereby an organosilicon oxide film having a low dielectric constant can be formed. In conventional processes for forming an organosilicon oxide film, it has been necessary to conduct a heat treatment at about 420° C. for about 30 minutes. According to the invention, however, a lower temperature shorter period heat treatment is possible due to the use of a chemical solution containing two specific polymers differing in molecular weight. The productivity in the process also can be improved.

The insulating film formed from the first and second polymers, differing in weight average molecular weight, has a low dielectric constant and is hence most suitable for use as an interlayer dielectric for a multilayer wiring. Consequently, a semiconductor device reduced in wiring capacitance and power consumption and capable of being operated at high speed can be produced by using the thus-formed organosilicon oxide film as an interlayer dielectric and forming a barrier metal layer, copper damascene wiring, etc., in an ordinary manner.

Due to the use of a chemical solution containing the two polymers, i.e., the first and second polymers, as described above, the insulating film formed has a mechanical strength increased to at least two times, and a modulus of elasticity of about 9 GPa can be secured. Although use of the two polymers is highly effective in improving mechanical strength, there are cases where the insulating film has a fine distribution of film quality depending on the combination of the first and second polymers. This distribution has a period almost equal to the size of the first polymer (about several 100 Å)

The film in homogeneity attributable to this distribution may arouse the following trouble. In a dry etching step for forming wiring grooves and via holes in the organosilicon oxide film, there are cases where side walls of the wiring grooves or via holes come to have recesses and protrusions depending on the etching apparatus and conditions especially when the organosilicon oxide film has a carbon concentration as high as, e.g., 15% by weight or above. This is because in order to inhibit the so-called etching termination phenomenon, in which the etching depth comes not to reach a given level, it is necessary to inhibit the deposition of a polymer usually serving as a protective layer on the side walls of the wiring grooves or via holes during dry etching. Furthermore, in the step of CMP, in which polishing by a chemical reaction is generally used in combination with physical polishing, there are cases where the organosilicon oxide film surface comes to have recesses and protrusions, as in dry etching, especially when the polishing is conducted under such conditions that the chemical solution for CMP contains a large amount of a chemical in which the silicon oxide film dissolves, such as hydrofluoric acid, so as to enable chemical polishing to proceed preferentially.

Especially when a buried wiring is to be formed, recesses and protrusions in side-wall parts of wiring grooves or via holes make it difficult to form, in an even thickness, a barrier metal layer which is necessary for copper wiring formation. In some cases, the side walls of the wiring grooves or via holes come to have regions having no barrier metal layer, and this may result in failures attributable to poor barrier properties, e.g., leakage between wirings.

This phenomenon can be avoided by further incorporating into the chemical solution a third polymer which differs in weight average molecular weight from each of the first and second polymers. The third polymer is a compound comprising methylpolysiloxane as the main component and has a weight average molecular weight lower than the first polymer and higher than the second polymer. The weight average molecular weight of the third polymer is more preferably not higher than one-tenth the weight average molecular weight of the first polymer and is at least 10 times the weight average molecular weight of the second polymer. For example, a compound represented by general formula (1) and satisfying this requirement concerning molecular weight can be used as the third polymer.

Since the third polymer has a weight average molecular weight lower than the weight average molecular weight of the first polymer and higher than the weight average molecular weight of the second polymer, it contributes to an improvement in the homogeneity of the organosilicon oxide film to be obtained. In the insulating film formed from a chemical solution containing the third polymer besides the first and second polymers, the three polymers differing in molecular weight are packed more densely. Because of this, even when the insulating film has unevenness at a period almost equal to the size of the first polymer, this unevenness is corrected by the third polymer. Consequently, the insulating film is less apt to have a film quality distribution.

Even through dry etching or a CMP step, this insulating film is free from the formation of surface recesses and protrusions on wiring groove side walls, via hole side walls, etc. Even through various wet processings (chemical treatments) such as the post-treatment conducted subsequently to dry etching, the insulating film surfaces including the side walls of wiring grooves are kept smooth. Since the insulating film has smooth surfaces free from recesses and protrusions, a barrier metal layer can be formed in an even thickness. In the case where a copper wiring is formed on the barrier metal layer in a subsequent step, no leakage failures occur between lines in this copper wiring. Thus, a wiring having satisfactory properties can be formed.

Furthermore, because of the evenness of film quality, the depth to which an etching gas, e.g., fluorine, penetrates into the insulating film in dry etching is small and liquid chemicals also penetrate only to a small depth into the film in various wet processings (chemical treatments). Consequently, the possibility that a heat treatment step might arouse troubles such as gas generation is diminished.

In addition, due to the incorporation of the third polymer, which has a different molecular weight, the insulating film obtained has further enhanced mechanical strength. Consequently, the frequency of occurrence of scratches on the insulating film during a CMP step can be considerably reduced, so that the film undergoes neither gas accumulation nor crack enlargement even when subjected to heat treatment. The use of the chemical solution containing three polymers differing in molecular weight further enables an insulating film having a thickness of 1.0 µm or larger to be formed through one coating operation. When the chemical solution is applied repeatedly, a film having a thickness as large as 1.5 µm or above can be obtained. An insulating film having a thickness of 1.0 µm or larger is suitable for use as an interlayer dielectric for a global routing (uppermost wiring). Moreover, in a burning step after the formation of a metallic wiring, the insulating film is inhibited from cracking even when the metal as the wiring material expands, because the insulating film has high mechanical strength.

The content of the third polymer is desirably from 5 to 80% by weight based on the total amount of the first, second, and third polymers so as to sufficiently obtain the effects of the third polymer.

As described above, the additional incorporation of the third polymer, which has a different molecular weight, not only enables the insulating film formed from the chemical solution to have homogeneity but also brings about an effect that the film has further enhanced mechanical strength.

The invention will be explained below in more detail with respect to Examples thereof by reference to drawings.

EXAMPLE 1

Figure 5:
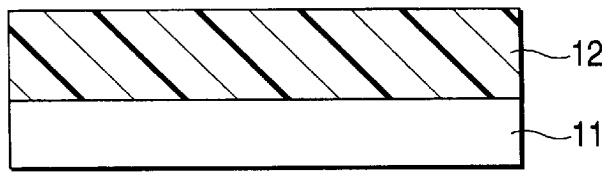
FIG. 5 is a sectional view explaining the method of forming an insulating film used in Example 1.

An organosilicon oxide film 12 was formed on a silicon substrate 11 as shown in FIG. 5 in the following manner.

First, methylpolysiloxane having a weight average molecular weight of 1,000,000 as a first polymer having a high molecular weight and methylpolysiloxane having a weight average molecular weight of 10,000 as a second polymer having a low molecular weight were dissolved in any of various proportions in propylene glycol monoethyl ether as a solvent to prepare a chemical solution. The polymers used each were a compound represented by formula (1) wherein $CH_3/Si$ was 0.72.

The chemical solution obtained was applied with a coater, and the coating was heat-treated at 80° C. for 1 minute, subsequently at 200° C. for 1 minute, and then at 380° C. for 20 minutes (in $N_2$ atmosphere having an oxygen concentration of 500 ppm or lower). Thus, an organosilicon oxide film 12 was formed.

By varying the polymer concentration and the rotational speed during coating, organosilicon oxide films 12 having various thicknesses were formed on silicon substrates 11.

The various organosilicon oxide films 12 obtained were examined for cracking resistance and for the thickness of an altered layer formed by an $O_2$ plasma treatment. In the cracking resistance examination, the organosilicon oxide films 12 having various film thicknesses were allowed to stand in the air for 1 day and then examined for surface cracks in light obliquely incident thereon. Cracking resistance is expressed in terms of the thickness of the thickest film which suffered no cracking. In determining the thickness of an altered layer formed by an $O_2$ plasma, the organosilicon oxide film 12 formed was exposed to an $O_2$ plasma atmosphere for 1 minute to alter the surface of the film. The thickness of a surface layer thereof which dissolved in 1% by weight hydrofluoric acid solution was measured and this thickness value was taken as the thickness of the altered layer. The altered layer thickness greatly depends on the plasma treatment conditions. In this Example, reactive ion etching (RIE) with an $O_2$ gas, with which a reduction in altered-layer thickness is attainable, was used.

Figure 6:
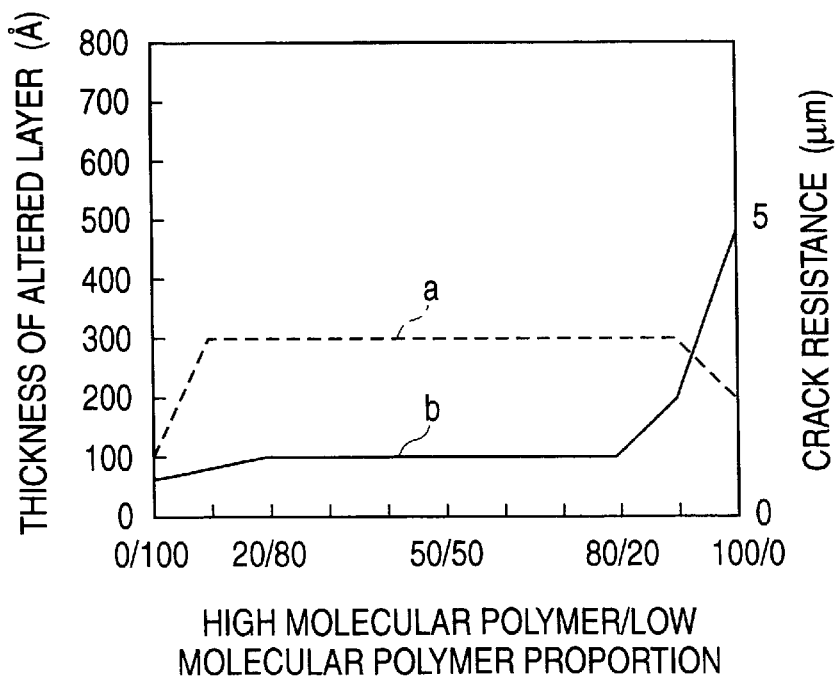
FIG. 6 is a graphic presentation showing the relationship between the high molecular polymer/low molecular polymer proportion (by weight) and each of the thickness of an altered layer and the thickness of a crack-resistant film.

The relationship between the proportion (by weight) of the polymers used and each of the cracking resistance of the organosilicon oxide films obtained and the thickness of an altered layer formed by the plasma treatment is shown by the graphs given in FIG. 6.

In the graph of FIG. 6, "a" indicates cracking resistance and "b" indicates altered layer thickness. As long as the proportion (by weight) of the high molecular polymer to the low-molecular polymer is within the range of from 10/90 to 90/10, a cracking resistance of 3 µm is obtained.

Furthermore, when that proportion is in the range of from 0/100 to 80/20, an altered layer thickness reduced to 100 Å or smaller can be attained. The higher the cracking resistance, the more the organosilicon oxide film is suitable for use as an interlayer dielectric. For use as an interlayer dielectric, the organosilicon oxide film is required to have an altered layer thickness of 100 Å or smaller.

When the high molecular polymer only was used, an altered layer having a thickness of 500 Å was formed. It is thought that the organosilicon oxide film obtained from that polymer only was not homogeneous and, hence, oxygen radicals penetrated into the organosilicon oxide film during exposure to the $O_2$ plasma and reacted with $CH_3$ groups to form the altered layer.

As demonstrated in this Example, the use of a mixture of a high molecular polymer and a low molecular polymer is thought to give a homogeneous film prevented from suffering oxygen radical penetration and hence be effective in attaining a reduced altered layer thickness. In addition, the results show that the organosilicon oxide films formed from blends of the high molecular polymer and the low molecular polymer had better cracking resistance than the organosilicon oxide film formed from either of the two polymers.

EXAMPLE 2

In this Example, interlayer dielectrics each consisting of an organosilicon oxide film were formed from a mixture of a first polymer and a second polymer in various proportions (by weight). A copper damassin wiring was further formed thereon to produce semiconductor devices. The organosilicon oxide films were examined for a change in dielectric constant caused by an $O_2$ plasma.

FIG. 7 shows sectional views illustrating steps of the semiconductor device production process used in this Example.

Figure 7A:
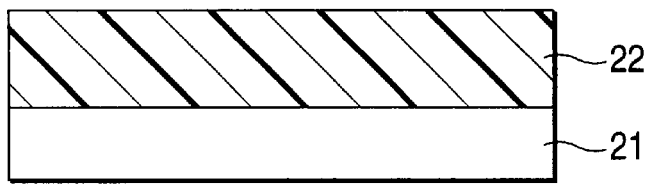
FIG. 7 is sectional views showing steps of the semiconductor device production process used in Example 2 as an embodiment of the invention.
Figure 7B:
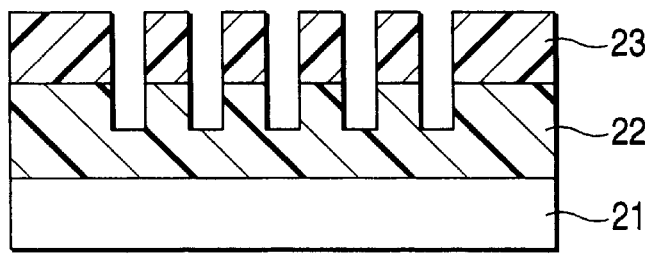

First, an interlayer dielectric 22 comprising an organosilicon oxide film was formed on a silicon substrate 21 having elements (not shown) formed thereon, as shown in FIG. 7A. The organosilicon oxide film was formed in the following manner. First, methylpolysiloxane having a weight average molecular weight of 1,000,000 as a first polymer having a high molecular weight and methylpolysiloxane having a weight average molecular weight of 10,000 as a second polymer having a low molecular weight were dissolved in any of various proportions in cyclohexanone as a solvent to prepare a chemical solution. The polymers used each were a compound represented by formula (1) wherein $CH_3/Si$ was 0.72.

The chemical solution obtained was applied to the silicon substrate 21 with a coater, and the coating was cured at 400° C. in $N_2$ ($O_2$ concentration, 500 ppm or lower). Thus, an interlayer dielectric 22 comprising an organosilicon oxide film having a thickness of 1 μm was formed.

On the interlayer dielectric 22 obtained were formed an antireflection layer (ARL) (not shown) and a resist film (not shown). This coated substrate was pattern-wise exposed and developed. Thus, an antireflection layer pattern and a resist pattern were formed as an etching mask 23. This etching mask 23 was used to process the interlayer dielectric 22 by RIE to form the structure shown in FIG. 7B.

Figure 7C:
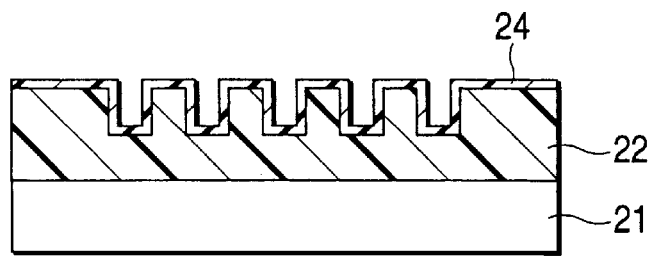

Thereafter, the antireflection layer pattern and resist pattern used as the etching mask 23 were removed by RIE with $O_2$ to thereby form grooves for wiring in the interlayer dielectric 22 as shown in FIG. 7C. In this structure, the interlayer dielectric 22 had an altered layer 24 on the surface thereof, including the walls of the grooves, which had been exposed to an $O_2$ plasma.

Figure 7D:
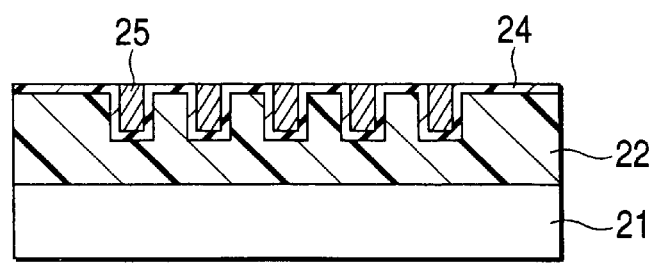

TaN and copper were deposited by sputtering and plating in the grooves formed in the interlayer dielectric 22. Thereafter, the TaN and copper deposited in the regions other than the grooves were removed by CMP to form a copper damassin wiring 25 as shown in FIG. 7D.

Various organosilicon oxide films were formed as interlayer dielectrics 22 in the same manner as described above, expect that the proportion (by weight) of the first polymer to the second polymer was varied. A copper damassin wiring 25 was formed on the interlayer dielectrics 22 in the same manner.

Each copper wiring buried by the method described above was examined for capacitance between wiring lines at 25° C. and 120° C. to thereby examine the influence of the formation of an altered layer on an increase in the dielectric constant of the interlayer dielectric. The relationship between polymer proportion (by weight) and dielectric constant change at each temperature is graphically shown in FIG. 8.

Figure 8:
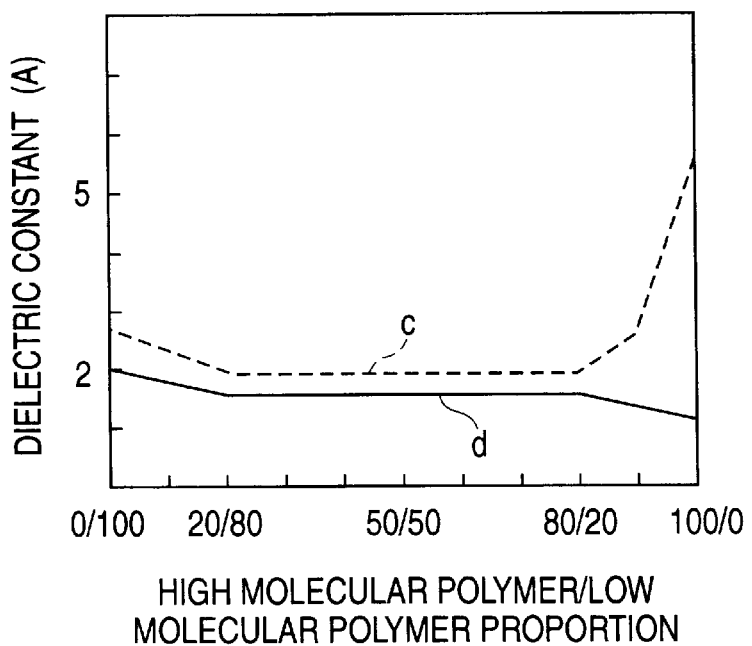
FIG. 8 is a graphic presentation showing the relationship between the high molecular polymer/low molecular polymer proportion (by weight) and dielectric constant.

In the graph of FIG. 8, "c" shows the results obtained at 25° C. and "d" shows the results obtained at 120° C. In the case where the weight proportion of the high molecular polymer is in the range of from 20 to 80, the dielectric constants at 25° C. and 120° C. differ little, i.e., 2.9 and 2.8, respectively. However, the results show that when the weight proportion of the high molecular polymer exceeds 90, the dielectric constant at 25° C. increases abruptly, resulting in an exceedingly large difference between the dielectric constant at 25° C. and that at 120° C. This increase in 25° C. dielectric constant corresponds to the change in altered layer thickness shown in FIG. 6, and is thought to be attributable to water adsorption onto the altered layer. Namely, it is thought that the altered layer, through the $O_2$ plasma treatment, had changed from hydrophobic to hydrophilic due to elimination of organic components therefrom and, hence, water present in the air was adsorbed onto the altered layer, resulting in an increase in dielectric constant. It is further thought that at 120° C., the adherent water was desorbed to lower the dielectric constant.

From the results of this Example, it was ascertained that by using a mixture of methylpolysiloxane having a weight average molecular weight of 1,000,000 or higher and methylpolysiloxane having a weight average molecular weight of 10,000 or lower, an interlayer dielectric can be formed which simultaneously has satisfactory plasma resistance and cracking resistance and has a low dielectric constant.

Namely, the graphs given in FIG. 8 show that the proportion (by weight) of the first polymer having a high molecular weight to the second polymer having a low molecular weight is preferably from 10/90 to 90/10 from the standpoint of improving cracking resistance as stated in Example 1, and that from the standpoint of securing a low dielectric constant regardless of temperatures, that proportion is especially preferably from 20/80 to 80/20.

In this Example, polymers respectively having molecular weights of 1,000,000 and 10,000 were used as first and second polymers, respectively. However, use of polymers respectively having molecular weights of 2,000,000 and 1,000 as first and second polymers was also ascertained to be effective in improving plasma resistance and cracking resistance.

The interlayer dielectrics formed by the method used in this Example have a dielectric constant as low as about 2.8. It can hence be easily presumed that semiconductor devices having these interlayer dielectrics are reduced in wiring capacitance and power consumption.

EXAMPLE 3

A chemical solution was prepared by dissolving methylpolysiloxane having a weight average molecular weight of 2,000,000 as a first polymer, methylpolysiloxane having a weight average molecular weight of 2,000 as a second polymer, and methylpolysiloxane having a weight average molecular weight of 20,000 as a third polymer in cyclohexanone as a solvent. The first, second and third polymers were used in a proportion of 30/20/50 by weight. The polymers used here each were a compound represented by general formula (1) wherein $CH_3/Si$ was 0.72.

An interlayer dielectric comprising an organosilicon oxide film was formed on a silicon substrate having a buried copper wiring in the same manner as in Example 2, except that the chemical solution obtained above was used.

In the interlayer dielectric thus formed, no unevenness in film quality was observed. This interlayer dielectric was a homogeneous film. It is thought that due to the use of the three polymers differing in weight average molecular weight as starting materials, particles of the starting materials were packed more densely and, hence, the insulating film was less apt to have a distribution of film quality. Moreover, a further increase in mechanical strength was observed due to the improved denseness. Specifically, the modulus of elasticity of the insulating film obtained was 10 GPa.

Subsequently, wiring grooves and via holes were formed in the interlayer dielectric by dry etching. Tantalum was deposited as a barrier metal on the whole surface by sputtering to thereby form the structure shown in FIG. 9.

Figure 9:
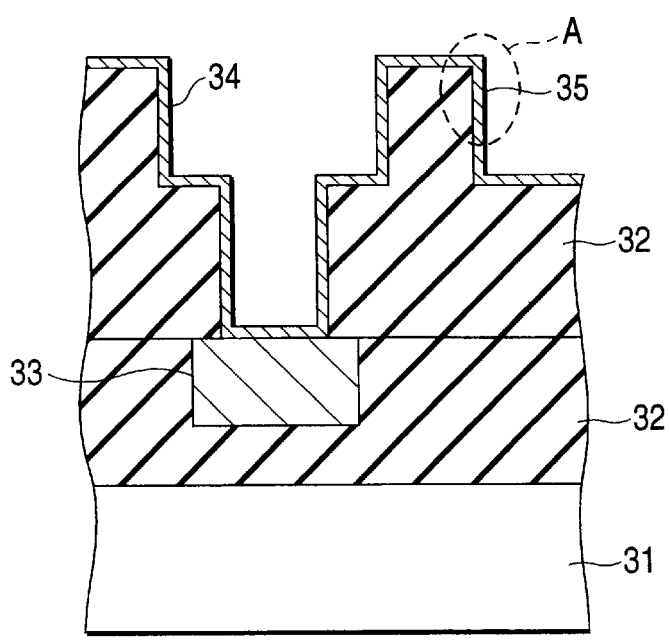
FIG. 9 is a diagrammatic view showing the structure of side walls in the formation of a wiring groove.

As shown in FIG. 9, this structure comprises a silicon substrate 31, a low dielectric constant interlayer dielectric 32 formed thereon having a buried copper wiring 33, and another low dielectric constant interlayer dielectric 32 formed thereon. The upper interlayer dielectric has wiring grooves and via holes 34 which reach the buried copper wiring 33. The whole surface is coated with a barrier metal layer 35.

Figure 10:
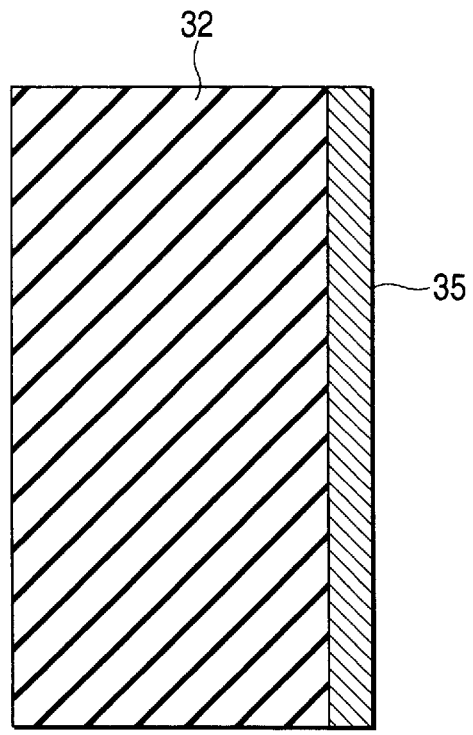
FIG. 10 is an enlarged view showing the structure of a side wall of the wiring groove.

An enlarged view of a region A of a side wall of one of the wiring grooves is shown in FIG. 10. As shown in FIG. 10, it was ascertained that the side wall of the wiring groove 34 had no recesses due to the homogeneity of the interlayer dielectric 32 and that the barrier metal layer 35 had an even thickness.

Subsequently, a copper wiring (not shown) was formed on the barrier metal layer 35 to produce a semiconductor device. As a result, a copper wiring having satisfactory properties could be formed which was free from leakage failures.

In this Example, an explanation was made on the case of using a starting material containing three polymers differing in weight-average molecular weight. However, a polymer differing in weight average molecular weight from each of the first to third polymers may be further incorporated. When a chemical solution containing a mixture of four or more polymers differing in weight average molecular weight was used to form an interlayer dielectric, the same effects as those described above were obtained.

For the purpose of comparison, the following examination was conducted. An interlayer dielectric comprising an organosilicon oxide film was formed on a silicon substrate having a buried copper wiring in the same manner as described above, except that the same first and second polymers as described above were mixed in a proportion of 30/70. Dry etching was then conducted to form wiring grooves and via holes. It was ascertained that the surface of the interlayer dielectric thus processed had recesses and protrusions at a period of about 100 Å. It is thought that use of the first polymer, having a high molecular weight, resulted in the formation of spaces and part of these spaces were not sufficiently filled with the second polymer, having a low molecular weight. Such spaces remaining unfilled are thought to be a cause of the surface recesses and protrusions.

Subsequently, a barrier metal layer was formed on the whole surface of the interlayer dielectric by the same method as described above to obtain the same structure as shown in FIG. 9.

Figure 11:
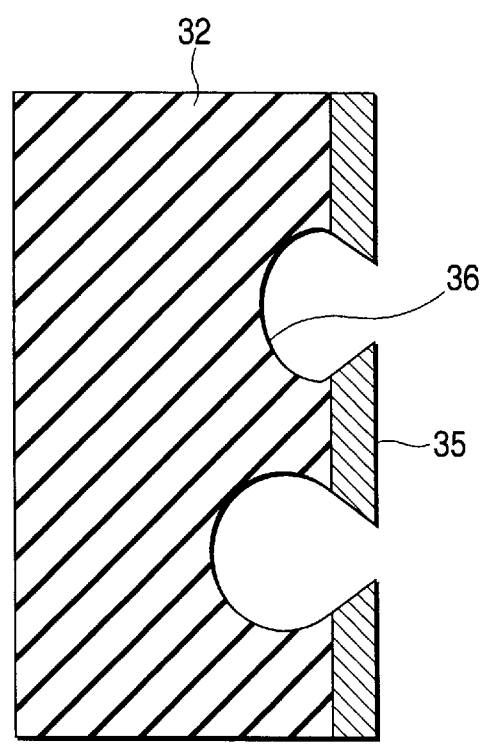
FIG. 11 is an enlarged view showing the structure of a side wall of a wiring groove.

An enlarged view illustrating the structure of a side wall of a wiring groove coated with the barrier metal layer is shown in FIG. 11. As shown in FIG. 11, the side of the interlayer dielectric 32 which had undergone dry etching had recesses 36 due to the inhomogeneity of the film, and the recesses 36 were not coated with the barrier metal layer 35. These regions are a cause of leakage failures in the copper wiring to be subsequently formed on the barrier metal layer 35.

As described above in detail, the invention provides a method of forming an insulating organosilicon oxide film having a low dielectric constant and high cracking resistance from a coating fluid. The invention further provides a process for producing a semiconductor device which is reduced in wiring capacitance and power consumption and can be operated at a high speed.

The invention is extremely useful in the production of a multilayered wiring structure and has a tremendous industrial value.

What is claimed is:

1. A method of forming an insulating film, which comprises the steps of:

dissolving in a solvent a first polymer and a second polymer which each comprise methylpolysiloxane as the main component and one of which has a weight average molecular weight at least 10 times the weight average molecular weight of the other to thereby prepare a chemical solution;

applying the chemical solution to a semiconductor substrate to form a coating film; and heat-treating the coating film, thereby forming an organosilicon oxide film.

2. The method of forming an insulating film of claim 1, wherein the weight average molecular weight of the first polymer is at least 100 times the weight average molecular weight of the second polymer.

3. The method of forming an insulating film of claim 1, wherein the weight average molecular weight of the first polymer is 1,000,000 or higher and the weight average molecular weight of the second polymer is 10,000 or lower.

4. The method of forming an insulating film of claim 1, wherein the proportion of the first polymer to the second polymer is from 10/90 to 90/10 by weight.

5. The method of forming an insulating film of claim 1, wherein the proportion of the first polymer to the second polymer is from 20/80 to 80/20 by weight.

6. The method of forming an insulating film of claim 2, wherein the chemical solution further contains a third polymer comprising methylpolysiloxane as the main component, the third polymer having a weight average molecular weight lower than the weight average molecular weight of the first polymer and higher than the weight average molecular weight of the second polymer, and the organosilicon oxide film is formed by thermally hardening the first, second, and third polymers.

7. The method of forming an insulating film of claim 6, wherein the weight average molecular weight of the third polymer is not higher than one-tenth the weight average molecular weight of the first polymer and is at least 10 times the weight average molecular weight of the second polymer.

8. The method of forming an insulating film of claim 6, wherein the content of the third polymer is from 5 to 80% by weight based on the total amount of the first, second and third polymers.

9. The method of forming an insulating film of claim 1, wherein the heat treatment is conducted at a temperature of 400° C. or lower.

10. The method of forming an insulating film of claim 1, wherein the heat treatment is conducted in a nitrogen atmosphere.

11. A process for producing a semiconductor device, which comprises the steps of:

dissolving in a solvent a first polymer and a second polymer which each comprise methylpolysiloxane as the main component and one of which has a weight average molecular weight at least 10 times the weight average molecular weight of the other to thereby prepare a chemical solution;

applying the chemical solution to a semiconductor substrate having elements arranged thereon to form a coating film;

heat-treating the coating film, thereby forming an interlayer dielectric comprising an organosilicon oxide film; and forming a wiring on the interlayer dielectric.

12. The process for producing a semiconductor device of claim 11, wherein the weight average molecular weight of the first polymer is at least 100 times the weight average molecular weight of the second polymer.

13. The process for producing a semiconductor device of claim 11, wherein the weight average molecular weight of the first polymer is 1,000,000 or higher and the weight average molecular weight of the second polymer is 10,000 or lower.

14. The process for producing a semiconductor device of claim 11, wherein the proportion of the first polymer to the second polymer is from 10/90 to 90/10 by weight.

15. The process for producing a semiconductor device of claim 11, wherein the proportion of the first polymer to the second polymer is from 20/80 to 80/20 by weight.

16. The process for producing a semiconductor device of claim 12, wherein the chemical solution further contains a third polymer comprising methylpolysiloxane as the main component, the third polymer having a weight average molecular weight lower than the weight average molecular weight of the first polymer and higher than the weight average molecular weight of the second polymer, and the organosilicon oxide film is formed by thermally hardening the first, second and third polymers.

17. The process for producing a semiconductor device of claim 16, wherein the weight average molecular weight of the third polymer is not higher than one-tenth the weight average molecular weight of the first polymer and is at least 10 times the weight-average molecular weight of the second polymer.

18. The process for producing a semiconductor device of claim 16, wherein the content of the third polymer is from 5 to 80% by weight based on the total amount of the first, second, and third polymers.

19. The process for producing a semiconductor device of claim 11, wherein the heat treatment is conducted at a temperature of 400° C. or lower.

20. The process for producing a semiconductor device of claim 11, wherein the heat treatment is conducted in a nitrogen atmosphere.

* * * * *